United States Patent
Lai et al.

(10) Patent No.: US 12,400,918 B2
(45) Date of Patent: Aug. 26, 2025

(54) QUALITY DETECTION METHOD AND APPARATUS

(71) Applicant: Taiwan Semiconductor Manufacturing Company, Ltd., Hsinchu (TW)

(72) Inventors: Yi-An Lai, Taipei (TW); Chih-Hua Wang, Hsinchu (TW); Chan-Hong Chern, Palo Alto, CA (US); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 656 days.

(21) Appl. No.: 17/677,335

(22) Filed: Feb. 22, 2022

(65) Prior Publication Data

US 2022/0415720 A1    Dec. 29, 2022

Related U.S. Application Data

(60) Provisional application No. 63/214,541, filed on Jun. 24, 2021.

(51) Int. Cl.
*H01L 21/66* (2006.01)
*H01L 21/02* (2006.01)
(Continued)

(52) U.S. Cl.
CPC ........ *H01L 22/20* (2013.01); *H01L 21/02381* (2013.01); *H01L 21/0254* (2013.01);
(Continued)

(58) Field of Classification Search
CPC ............... H01L 22/20; H01L 21/02381; H01L 21/0254; H01L 22/32; H01L 23/585;
(Continued)

(56) References Cited

U.S. PATENT DOCUMENTS

| 2013/0181226 A1* | 7/2013 | Saitoh | H01L 29/66431 |
| | | | 438/172 |
| 2016/0126149 A1* | 5/2016 | Zelsacher | H01L 29/66568 |
| | | | 438/17 |

(Continued)

FOREIGN PATENT DOCUMENTS

WO    WO-2019139624 A1 *   7/2019

*Primary Examiner* — Samuel Park
(74) *Attorney, Agent, or Firm* — FOLEY & LARDNER LLP

(57) ABSTRACT

A method of fabricating a device involves forming a plurality of structures, such that each structure of the plurality includes a substrate and an epitaxial layer on the substrate. The epitaxial layer and the substrate have a lattice mismatch. The method further includes forming an electrical contact on the epitaxial layer of a selected structure of the plurality of structures and performing a current leakage measurement quality control test for the selected structure of the plurality of structures through the electrical contact. The method also involves forming a device on each of the remaining structures of the plurality of structures if the selected structure passed the leakage measurement quality control test or discarding each of the remaining structures of the plurality of structures if the selected structure did not pass the leakage measurement quality control test.

20 Claims, 10 Drawing Sheets

(51) Int. Cl.
    *H01L 23/58*     (2006.01)
    *H10D 30/01*     (2025.01)
    *H10D 30/47*     (2025.01)
    *H10D 62/85*     (2025.01)

(52) U.S. Cl.
    CPC ............ *H01L 22/32* (2013.01); *H01L 23/585* (2013.01); *H10D 30/015* (2025.01); *H10D 30/475* (2025.01); *H10D 62/8503* (2025.01)

(58) Field of Classification Search
    CPC ........... H01L 29/2003; H01L 29/66462; H01L 29/7786; H01L 29/452; H01L 22/14; H01L 22/22
    See application file for complete search history.

(56) References Cited

U.S. PATENT DOCUMENTS

| | | | |
|---|---|---|---|
| 2017/0317068 A1* | 11/2017 | Kaneda | H01L 29/66734 |
| 2021/0098314 A1* | 4/2021 | Ebiike | H01L 22/14 |
| 2021/0151578 A1* | 5/2021 | Cao | H01L 21/28264 |

* cited by examiner

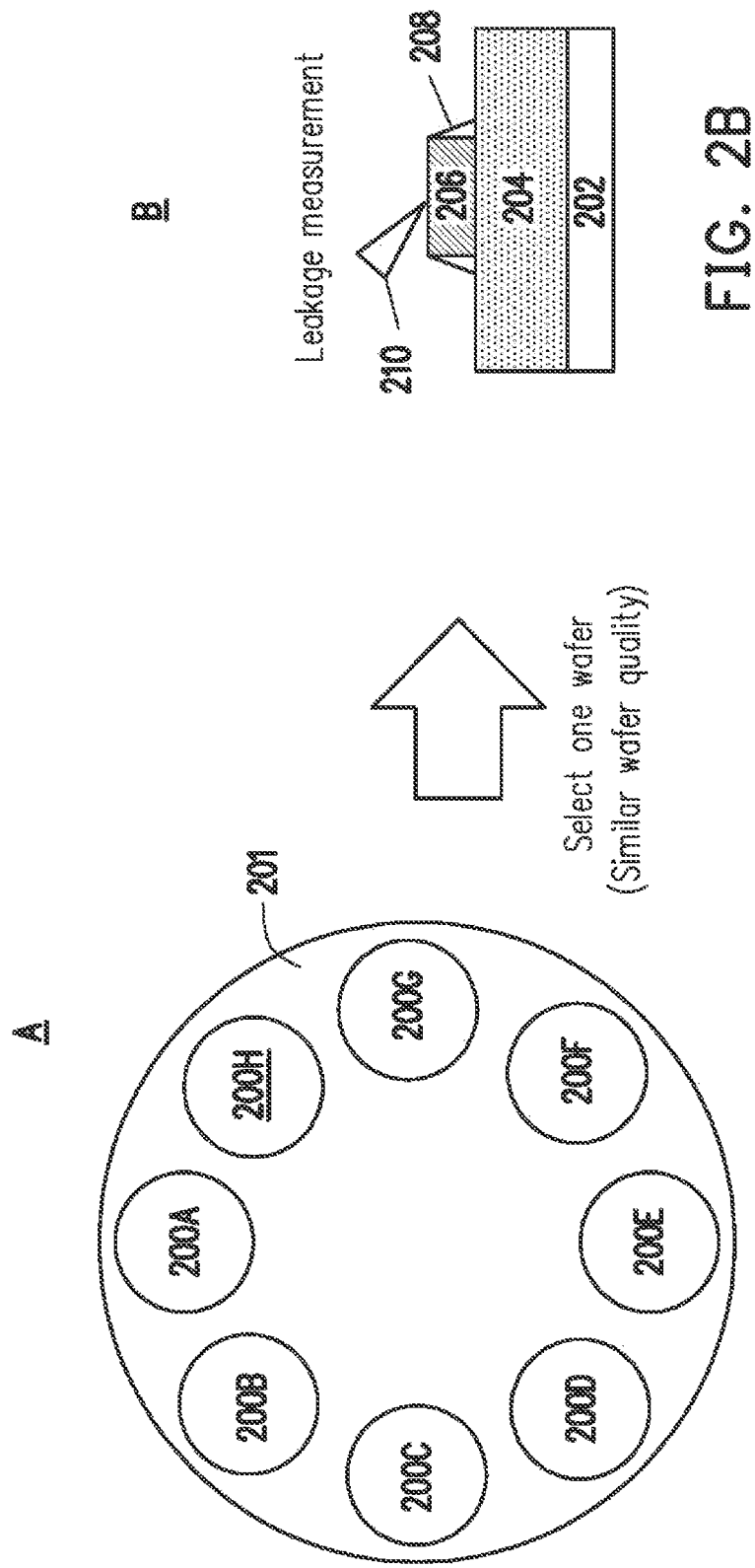

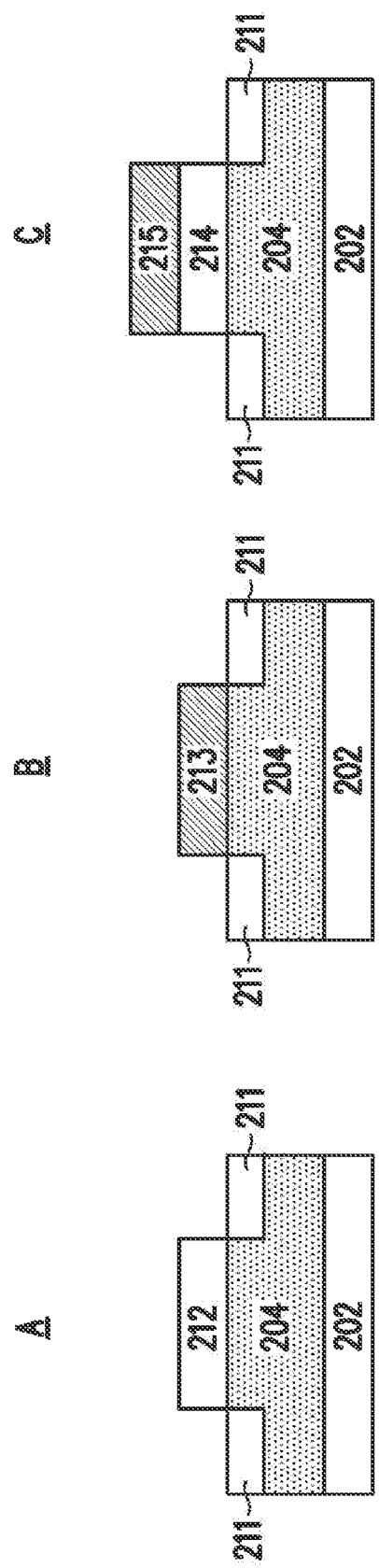

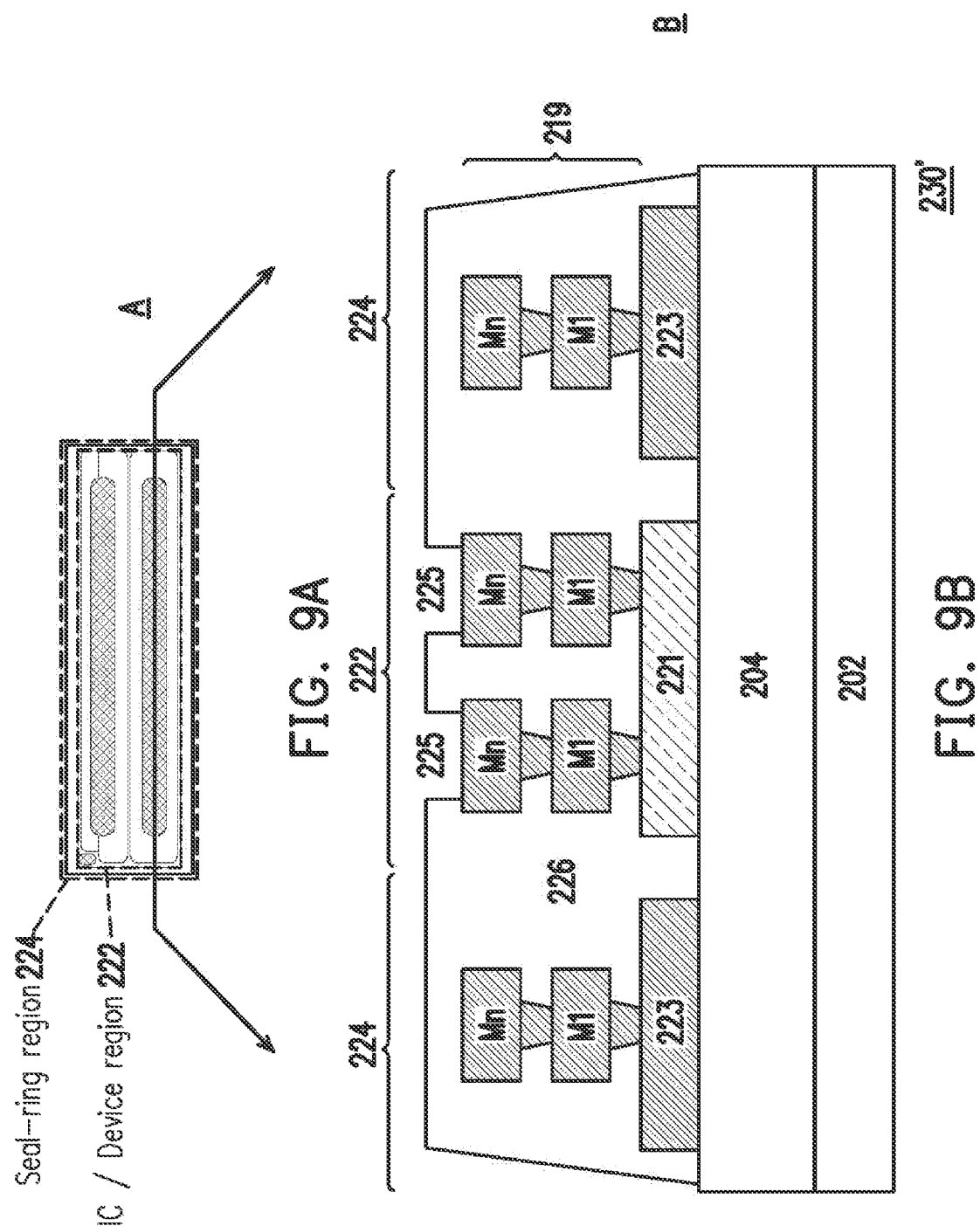

QUALITY DETECTION METHOD AND APPARATUS

CROSS-REFERENCE TO RELATED APPLICATION

This application claims priority to and the benefit of U.S. Provisional Application No. 63/214,541, filed Jun. 24, 2021, entitled "Highly Sensitive Apparatus and Method for Quality Detection in Epitaxial GaN" which is incorporated herein by reference in its entirety for all purposes.

BACKGROUND

Wide-bandgap semiconductor materials, such as Gallium-Nitride (GaN) materials, have unique material characteristics, which includes low on-resistance, high operation frequency and high breakdown voltage. These benefits can make power conversion more energy and space efficient. GaN can be grown on silicon substrates, which allows the use of silicon manufacturing capability and lower cost. However, GaN-on-Silicon have a substantial lattice mismatch, which often results in crystal defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-B illustrates selecting a wafer with an epitaxial layer from a batch of wafers for leakage measurement.

FIG. 6A-C illustrate possible modifications for wafers of a batch if a selected wafer of the batch passed the leakage test.

FIG. 9A-B show an exemplary device with a device region and a seal region surrounding a device region.

DETAILED DESCRIPTION

Figure 1:
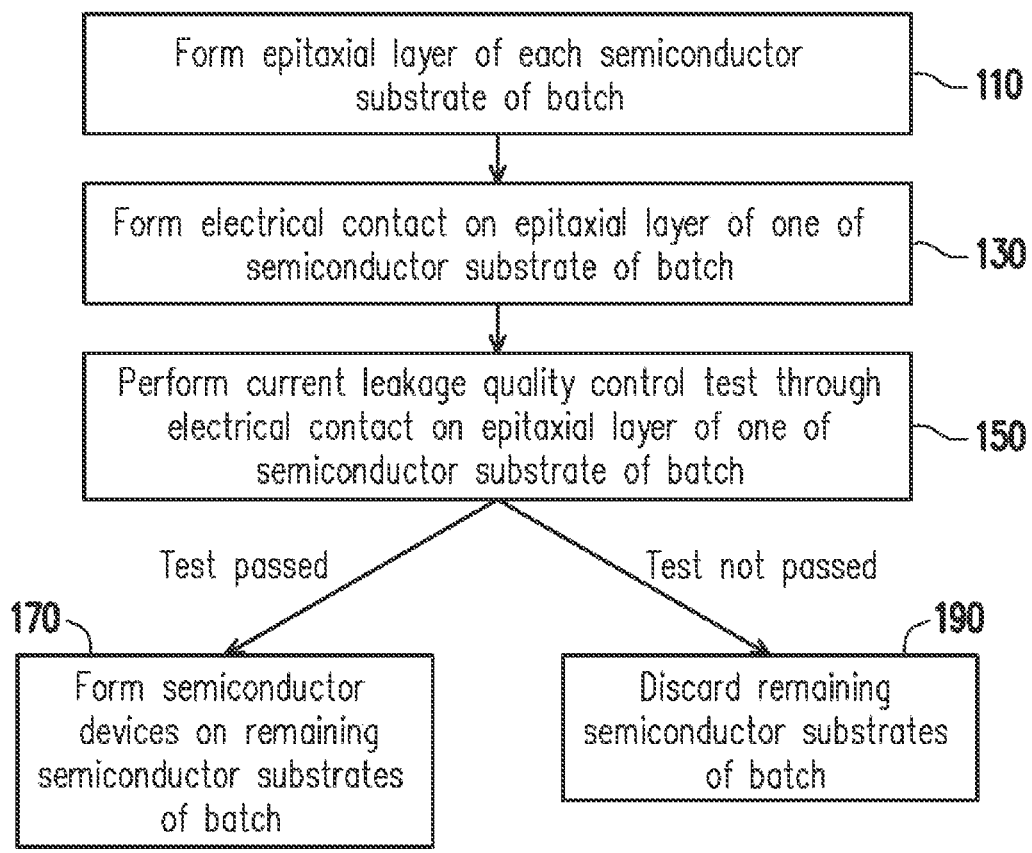
FIG. 1 illustrates the general methodology of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provide a methodology which involves a quality control test for a device, such as a semiconductor device, which involves forming on a substrate an epitaxial layer which has a lattice mismatch with the substrate, before forming additional components of the device. The lattice mismatch may mean that a lattice parameter and/or a crystalline lattice structure of the formed epitaxial layer differ from the one or both of the substrate. Crystalline lattice structures may have one, two or three lattice parameters. The lattice mismatch may mean that at least one lattice parameter of a crystalline lattice structure of a material of the substrate differs from at least one lattice parameter of a crystalline lattice structure of the epitaxial layer by at least 0.5 Å, or at least 0.75 Å or at least 1.0 Å or at least 1.25 Å or at least 1.5 Å or at least 1.75 Å or at least 2.0 Å or at least 2.25 Å.

FIG. 1 illustrates the present methodology. In step 110, an epitaxial layer is formed on each substrate of a batch, which includes plural substrates, which can be overall identical. The epitaxial layer may formed on each substrate of the batch in a single process. The formed epitaxial layer has a lattice mismatch with a material of the substrate(s). One substrate of the batch with the formed epitaxial layer, may be selected for a quality control test. In step 130, an electrical ohmic contact, such a metallic contact, may be formed on the epitaxial layer, of the substrate selected for the quality control test. The electrical ohmic contact may have lateral dimensions, i.e. dimensions parallel to the surface of the substrate, which correspond to a size of an active region for a desired semiconductor device. In step 150, the quality control test is performed on the selected substrate through the electrical contact. The quality control test involves applying a voltage between the electrical contact and the bottom surface of the substrate and measuring a current leakage on between the epitaxial layer and the substrate. If the selected substrate fails the quality control test, e.g. the measured leakage current is greater than a threshold leakage current value, then all the substrates of the batch with their epitaxial layers are discarded, see step 190. If the selected substrate passes the quality control test, e.g. the measured leakage current does not exceed the threshold leakage current value, then all the remaining substrates of the batch with their epitaxial layers, are used for forming a device, such as a semiconductor device, see step 190. In some embodiments, the selected substrate, which passed the quality control test, may be discarded after the quality control test. Yet in some embodiments, a semiconductor device may be fabricated on the selected substrate, which passed the quality control test. Such semiconductor device may be a semiconductor device with a seal ring region shown in FIGS. 8 and 9A-B. The ohmic contact on the selected substrate, which passed the quality control test, may become a part of the seal ring region.

FIG. 2A schematically illustrates a batch of substrates 200A-200H. Each of these substrates has an epitaxial layer formed on the material of the substrate in a single process. The material of the substrates and the epitaxial layer have a lattice mismatch. As shown in FIG. 2A, each of the substrates 200A-200H may be placed on a holder 201 and introduced in a deposition chamber, such as an epitaxial growth chamber, in which the epitaxial layer may be formed on each of the substrate 200A-200H simultaneously. One of the substrates 200A-200H, substrate 200H in FIG. 2A is selected from a quality control leakage measurement. FIG. 2B shows substrate 200H with original substrate material 202 of the substrate with epitaxial layer 204, formed on original substrate material 202, and ohmic electrical contact element 206, such as a metal contact, on top of epitaxial layer 204. Electrical contact 206 may have optional insulating material 208 along its side edges. For the quality control test, an electrode 210 of a quality testing apparatus is brought into electrical contact with ohmic electrical contact element 206 to provide electrical voltage between electrical contact element 206 and bottom of original substrate material 202. The quality testing apparatus measures a current leakage between original substrate material 202 and epitaxial layer 204. If the measured current leakage for substrate 200H is above a current leakage threshold value, then each of remaining substrates 200A-200G of the batch is discarded. If the measured current leakage for substrate 200H does not exceed the current leakage threshold value, then each of remaining substrates 200A-200G (each of which include an original substrate material layer 200 similar to layer 202 of tested substrate 200H and an epitaxial layer, similar to layer 204 of tested substrate 200H) is used for forming a device, such as semiconductor device. Lateral dimensions of ohmic electrical contact 206 in substrate 200H selected for the current leakage quality control test may correspond to lateral dimensions of an active region of the device, such as a region defined by shallow trench isolation, formed on each of the remaining substrates 200A-200G of the batch. In some embodiments, one or both lateral dimensions of ohmic electrical contact 206 may be 1 micron or more.

Although FIG. 2A illustrates the batch, which has eight substrates, a batch size may vary. In some embodiments, a batch may include at least 5 substrates or at least 6 substrates or at least 7 substrates or at least 8 substrates or at least 9 substrates or at least 10 substrates or at least 11 substrates or at least 12 substrates or at least 13 substrates or at least 14 substrates or at least 15 substrates or at least 16 substrates or at least 17 substrates or at least 18 substrates or at least 19 substrates or at least 20 substrates.

Figure 3A:
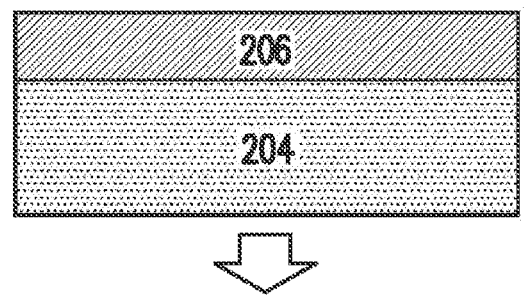
FIG. 3A-D illustrates a process of forming a contact on an epitaxial layer of a wafer selected for leakage measurement.
Figure 3B:
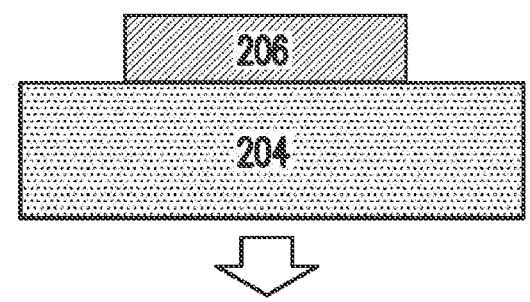
Figure 3C:
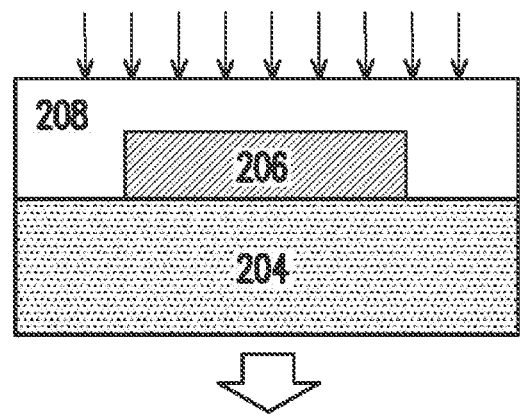
Figure 3D:
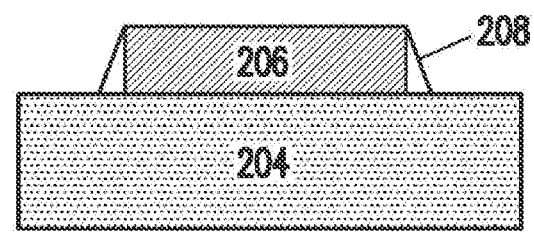

FIG. 3A-D illustrate forming ohmic electrical contact element 206 on epitaxial layer 204, of substrate 200H selected for the quality control leakage test. For the sake of simplicity, FIG. 3A-D do not show original substrate material layer 202 underneath epitaxial layer 204. In FIG. 3A, electrically conducting material 206 is deposited on the top surface of epitaxial layer 204. The electrically conducting material 206 may be for example, electrically conducting carbon, or a metal, such as copper, titanium, tungsten, aluminum, silver, gold, ruthenium, platinum, or their alloys. In some embodiments, the electrically conducting material 206 may be one or more of titanium, aluminum, AlCu or TiN. The electrically conducting material 206 may be deposited using a physical deposition technique, such as evaporation or sputtering. In FIG. 3B, electrically conducting material 206 is patterned using a mask. The mask may provide electrically conducting material 206 with lateral dimensions which may correspond to lateral dimensions of an active region of a device, which is considered to be formed on the remaining substrates of the batch, such substrates 200A-200G, if selected substrate 200H passes current leakage quality control test. As the result of the patterning, the lateral dimensions of the electrically conducting material 206 are reduced and a portion of the top surface of epitaxial layer 204 is reexposed. In FIG. 3C, insulating layer 208 is deposited over the patterned electrically conducting material 206. Insulating layer 208 may be an oxide layer, such as a silicon oxide layer. Insulating layer 208 may be formed using for example, a chemical vapor deposition. Insulating layer 208 may be implanted with oxygen atoms and annealed. The annealing process may be rapid thermal processing performed at a temperature from 400 C to 500 C, such as 450 C, for a few seconds, such as 30 seconds or less, 20 seconds or less, 15 seconds or less, 10 seconds or less, 5 seconds or less. Insulating layer 208 may protect surface morphology of epitaxial layer 206 during implantation with oxygen atoms and annealing. In FIG. 3D, most of insulating layer 208 may be etched to expose top surface of patterned electrically conducting material 206. Some portions of insulating layer 208 may remain of outer sides of patterned electrically conducting material 206. Insulating layer 208 may be etched using a dry etching technique, such as plasma etching, a wet etching technique, which may be, for example, buffered HF etching, or their combination. The substrate 200H after the modifications as showed in FIG. 3D is subjected for the current leakage quality test as shown in FIG. 2B.

The substrate is formed of a material, such as a crystalline material, which has a lattice mismatch, with a subsequently grown epitaxial layer.

In some embodiments, the material of the substrate may be a semiconductor material, such as a Group IV semiconductor material, a Group III-V semiconductor material or a Group II-VI semiconductor material. The semiconductor material of the substrate may be doped or undoped.

Examples of Group IV semiconductor materials which may be used as a substrate include elemental Group IV crystalline semiconductor materials, such as crystalline silicon, crystalline germanium or crystalline tin; and binary Group IV crystalline semiconductor materials, such as SiGe, SiC or GeC; ternary Group IV crystalline semiconductor materials, such as SiGeC. Group IV semiconductor materials may be n-doped with one or more n-dopants, such as phosphorous, antimony, arsenic, bismuth or lithium. Group IV semiconductor materials may p-doped with one or more p-dopants, such as boron, aluminum, gallium or indium.

Examples of Group III-V semiconductor materials which may be used as a substrate include binary Group III-V crystalline semiconductor materials, such as BN, AlN, GaN, InN, BP, AlP, GaP, InP, BAs, AlAs, GaAs, InAs, BSb, AlSb, GaSb, InSb; and ternary Group III-V crystalline semiconductor materials, such as $In_xGa_{1-x}N$ (0<x<1), $In_xGa_{1-x}P$ (0<x<1), $In_xGa_{1-x}As$ (0<x<1), $In_xGa_{1-x}Sb$ (0<x<1), $Al_xIn_{1-x}N$ (0<x<1), $Al_xIn_{1-x}P$ (0<x<1), $Al_xIn_{1-x}As$ (0<x<1), $Al_xIn_{1-x}Sb$ (0<x<1), $Al_xGa_{1-x}N$ (0<x<1), $Al_xGa_{1-x}P$ (0<x<1), $Al_xGa_{1-x}NAs$ (0<x<1), $Al_xGa_{1-x}Sb$ (0<x<1). Group III-V semiconductor materials may be doped with one or more n-dopants, such as tellurium, sulfur (substituting Group V element(s)); tin, silicon, germanium (substituting Group III element(s)). Group III-V semiconductor materials may be doped with one or more p-dopants, such as beryllium, zinc, chromium (substituting Group III element(s)); silicon, germanium, carbon (substituting Group V element(s)).

Examples of Group II-VI semiconductor materials include CdTe and CdS which may be used as a substrate. Group II-VI semiconductor materials may be doped with one or more n-dopants, such as a Group III element, such as Al, Ga, In, substituting the Group II element(s), such as Cd; or a halogen, such F, Cl, I or Br, substituting the Group VI element(s). Group II-VI semiconductor materials may be doped with one or more p-dopants, such as a Group V element, such as P, substituting the Group VI; or a group I element, such as lithium or sodium, substituting the Group II element.

In some embodiments, the material of the substrate may be a non-semiconductor crystalline material, such as an insulating crystalline material, such as sapphire or quartz.

In some embodiments, the epitaxial layer, may comprise at least one crystalline semiconductor material, such as a Group IV crystalline semiconductor material, a Group III-V crystalline semiconductor material or a Group II-VI crystalline semiconductor material.

Examples of Group IV semiconductor materials which may be used in the epitaxial layer, include elemental Group IV crystalline semiconductor materials, such as crystalline silicon, crystalline germanium or crystalline tin; and binary Group IV crystalline semiconductor materials, such as SiGe, SiC or GeC; ternary Group IV crystalline semiconductor materials, such as SiGeC. Group IV semiconductor materials may be n-doped with one or more n-dopants, such as phosphorous, antimony, arsenic, bismuth or lithium. Group IV semiconductor materials may p-doped with one or more p-dopants, such as boron, aluminum, gallium or indium.

Examples of Group III-V semiconductor materials which may be used in the epitaxial layer include binary Group III-V crystalline semiconductor materials, such as BN, AlN, GaN, InN, BP, AlP, GaP, InP, BAs, AlAs, GaAs, InAs, BSb, AlSb, GaSb, InSb; and ternary Group III-V crystalline semiconductor materials, such as $In_xGa_{1-x}N$ $(0<x<1)$, $In_xGa_{1-x}P$ $(0<x<1)$, $In_xGa_{1-x}As$ $(0<x<1)$, $In_xGa_{1-x}Sb$ $(0<x<1)$, $Al_xIn_{1-x}N$ $(0<x<1)$, $Al_xIn_{1-x}P$ $(0<x<1)$, $Al_xIn_{1-x}As$ $(0<x<1)$, $Al_xIn_{1-x}Sb$ $(0<x<1)$, $Al_xGa_{1-x}N$ $(0<x<1)$, $Al_xGa_{1-x}P$ $(0<x<1)$, $Al_xGa_{1-x}NAs$ $(0<x<1)$, $Al_xGa_{1-x}Sb$ $(0<x<1)$. Group III-V semiconductor materials may be doped with one or more n-dopants, such as tellurium, sulfur (substituting Group V element(s)); tin, silicon, germanium (substituting Group III element(s)). Group III-V semiconductor materials may be doped with one or more p-dopants, such as beryllium, zinc, chromium (substituting Group III element(s)); silicon, germanium, carbon (substituting Group V element(s)).

Examples of Group II-VI semiconductor materials include CdTe and CdS which may be used in the epitaxial layer. Group II-VI semiconductor materials may be doped with one or more n-dopants, such as a Group III element, such as Al, Ga, In, substituting the Group II element(s), such as Cd; or a halogen, such F, Cl, I or Br, substituting the Group VI element(s). Group II-VI semiconductor materials may be doped with one or more p-dopants, such as a Group V element, such as P, substituting the Group VI; or a group I element, such as lithium or sodium, substituting the Group II element.

In some embodiments, the epitaxial layer may be a single layer film of a material having a lattice mismatch with the material of the substrate. Yet in some embodiments, the epitaxial layer may be a multilayer film formed of subsequently epitaxially grown layers, such that two adjacent layers have different compositions. At least one epitaxially grown layer of the multilayer film has a lattice mismatch with the material of the substrate.

In some embodiments, the epitaxial layer may be grown directly on the material of the substrate. Yet in some embodiments, the epitaxial layer may be grown on a buffer layer formed directly on the material of the substrate. The buffer layer may be formed of a crystalline material having a lattice parameter between those of the material of the substrate and the material of the epitaxial layer. The buffer layer may be used to reduce the effect of the lattice mismatch between the material of the substrate and the material of the epitaxial layer.

Table 1 provides lattice parameters and crystalline structures for selected materials, which may be used as a material of the substrate, a material of the epitaxial layer or both.

TABLE 1

Lattice Constants and Crystal structures of selected materials.

| Material | Lattice constant (Å) | Crystal structure |
|---|---|---|
| C (diamond) | 3.567 | Diamond (FCC) |
| C (graphite) | a = 2.461<br>c = 6.708 | Hexagonal |
| Si | 5.431020511 | Diamond (FCC) |
| Ge | 5.658 | Diamond (FCC) |
| AlAs | 5.6605 | Zinc blende (FCC) |
| AlP | 5.4510 | Zinc blende (FCC) |
| AlSb | 6.1355 | Zinc blende (FCC) |
| GaP | 5.4505 | Zinc blende (FCC) |
| GaAs | 5.653 | Zinc blende (FCC) |
| GaSb | 6.0959 | Zinc blende (FCC) |
| InP | 5.869 | Zinc blende (FCC) |
| InAs | 6.0583 | Zinc blende (FCC) |
| InSb | 6.479 | Zinc blende (FCC) |
| MgO | 4.212 | Halite (FCC) |
| SiC | a = 3.086<br>c = 10.053 | Wurtzite |
| CdS | 5.8320 | Zinc blende (FCC) |
| CdSe | 6.050 | Zinc blende (FCC) |
| CdTe | 6.482 | Zinc blende (FCC) |
| ZnO | a = 3.25<br>c = 5.2 | Wurtzite (HCP) |
| ZnO | 4.580 | Halite (FCC) |
| ZnS | 5.420 | Zinc blende (FCC) |
| PbS | 5.9362 | Halite (FCC) |
| PbTe | 6.4620 | Halite (FCC) |
| BN | 3.6150 | Zinc blende (FCC) |
| BP | 4.5380 | Zinc blende (FCC) |
| CdS | a = 4.160<br>c = 6.756 | Wurtzite |
| ZnS | a = 3.82<br>c = 6.26 | Wurtzite |
| AlN | a = 3.112<br>c = 4.982 | Wurtzite |
| GaN | a = 3.189<br>c = 5.185 | Wurtzite |
| InN | a = 3.533<br>c = 5.693 | Wurtzite |
| A-Al$_2$O$_3$ Sapphire | a = 4.785<br>c = 12.991 | Hexagonal |
| SiO$_2$ α-quartz | a = 4.9134<br>c = 5.4052 | Trigonal |

In some embodiments, the substrate may be a Group IV semiconductor substrate, such as a crystalline silicon substrate and the epitaxial layer may comprise a Group III-V semiconductor material, such as BN, AlN, GaN, InN, BP, AlP, GaP, InP, BAs, AlAs, GaAs, InAs, BSb, AlSb, GaSb, InSb, $In_xGa_{1-x}N$ $(0<x<1)$, $In_xGa_{1-x}P$ $(0<x<1)$, $In_xGa_{1-x}As$ $(0<x<1)$, $In_xGa_{1-x}Sb$ $(0<x<1)$, $Al_xIn_{1-x}N$ $(0<x<1)$, $Al_xIn_{1-x}P$ $(0<x<1)$, $Al_xIn_{1-x}As$ $(0<x<1)$, $Al_xIn_{1-x}Sb$ $(0<x<1)$, $Al_xGa_{1-x}N$ $(0<x<1)$, $Al_xGa_{1-x}P$ $(0<x<1)$, $Al_xGa_{1-x}NAs$ $(0<x<1)$, or $Al_xGa_{1-x}Sb$ $(0<x<1)$.

In some embodiments, the substrate may be an insulating crystalline substrate, such as a sapphire substrate or a quartz substrate and the epitaxial layer may comprise a Group III-V semiconductor material, such as BN, AlN, GaN, InN, BP, AlP, GaP, InP, BAs, AlAs, GaAs, InAs, BSb, AlSb, GaSb, InSb, $In_xGa_{1-x}N$ (0<x<1), $In_xGa_{1-x}P$ (0<x<1), $In_xGa_{1-x}As$ (0<x<1), $In_xGa_{1-x}Sb$ (0<x<1), $Al_xIn_{1-x}N$ (0<x<1), $Al_xIn_{1-x}P$ (0<x<1), $Al_xIn_{1-x}As$ (0<x<1), $Al_xIn_{1-x}Sb$ (0<x<1), $Al_xGa_{1-x}N$ (0<x<1), $Al_xGa_{1-x}P$ (0<x<1), $Al_xGa_{1-x}NAs$ (0<x<1), or $Al_xGa_{1-x}Sb$ (0<x<1).

The leakage current quality control test, such as the one illustrated in FIG. 2B, involves applying a voltage between the electrical contact 206 of epitaxial layer 204 and the bottom of substrate 202. For applying the voltage, the bottom of substrate 202 may be grounded. The applied voltage may depend on specific materials of substrate 202 and epitaxial layer 204. In some embodiments, the applied voltage may sweep, for example, from 0V to 1500V. A current-voltage slope for the applied voltage in the leakage current quality control test may be, for example, from 0.1 nA/V to 100 mA/V. A threshold leakage current may depend of a surface area of ohmic electrical contact 206 parallel to the surface of substrate 202 and/or the surface of epitaxial layer 204. In other words, the threshold leakage current may depend on the lateral dimensions of ohmic electrical contact 206, which may correspond to lateral dimensions of an active region of a semiconductor device, which will be formed on the remaining substrates of the batch, such as substrates 200A-200G, if the selected substrate of the batch, such as substrate 200G passes the leakage current quality control test. In some embodiments, the threshold leakage current may be from 0.2 nA to 500 µA. In some embodiments, the threshold current leakage value was about 10 mA.

FIGS. 4A-C and 5A-C provide comparison of quality control for the present methodology with a quality control procedure performed on a fully fabricated device with GaN epitaxial layer on a silicon substrate.

Figures 4A, 4B, 4C:
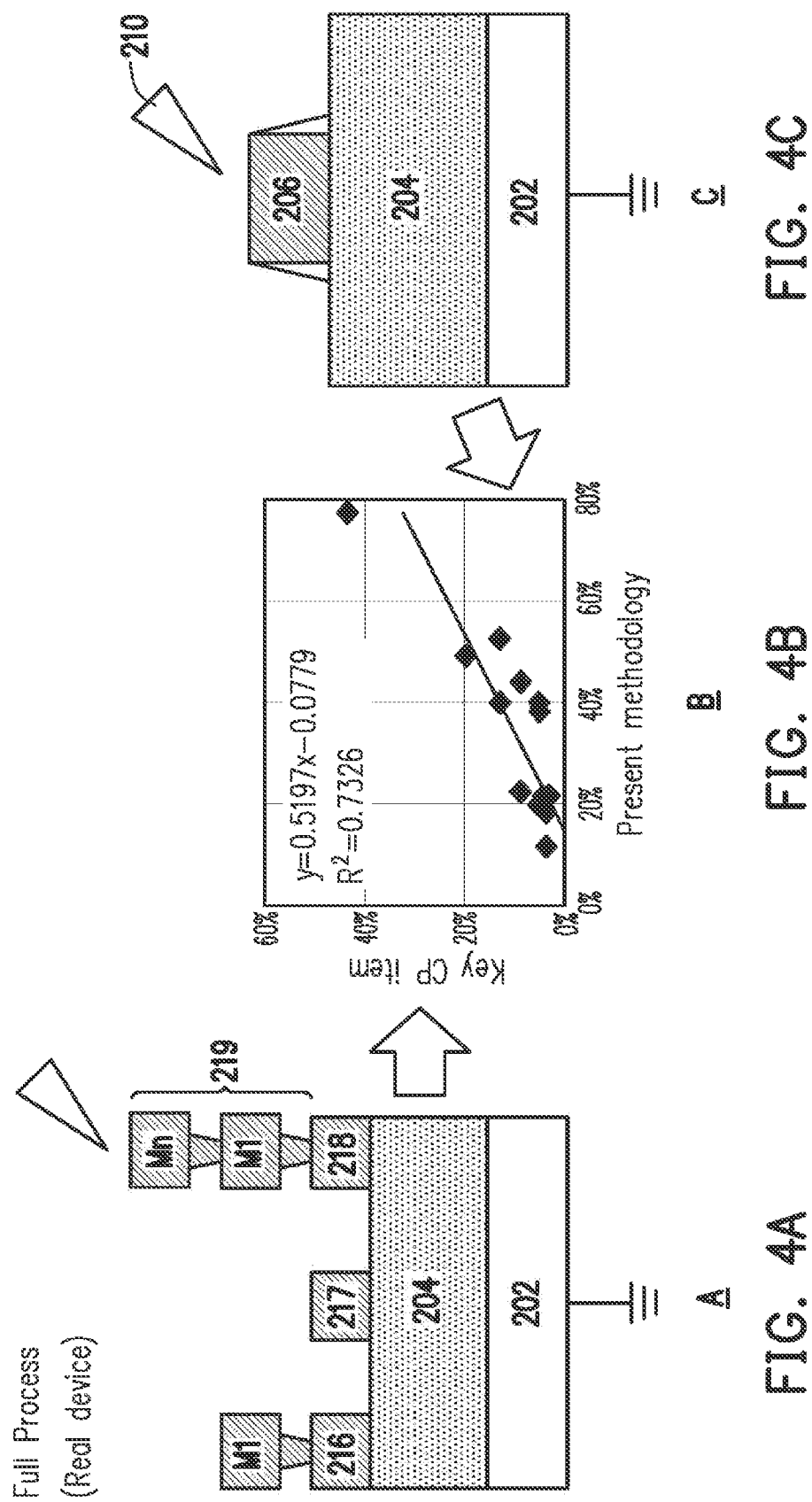
FIGS. 4A-C and 5A-C provides comparison of quality control for the present methodology with a quality control procedure performed on a fully fabricated device with GaN epitaxial layer on a silicon substrate.
Figures 5A, 5B, 5C:
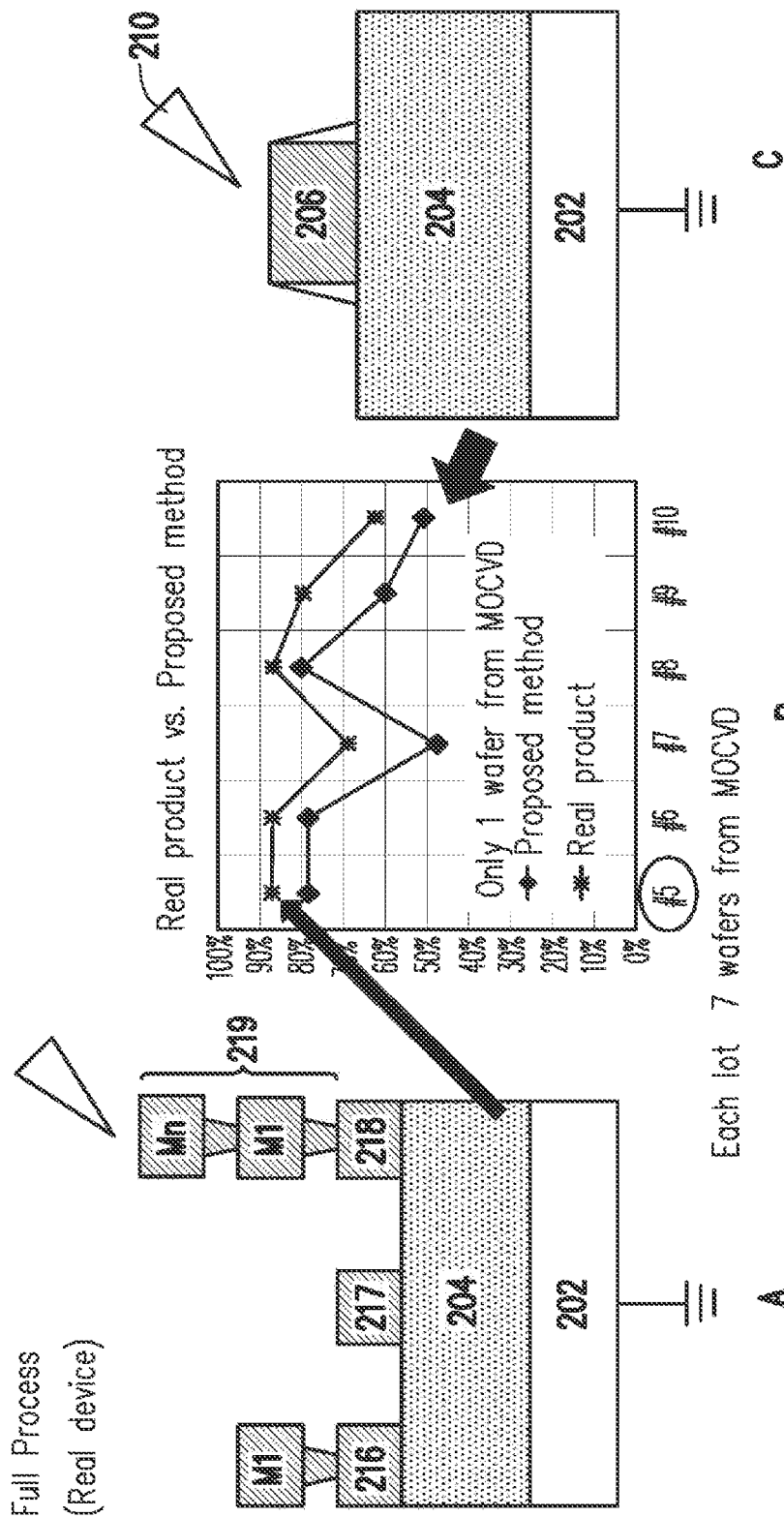

FIGS. 4A and 5A show an exemplary semiconductor device which was formed on each of seven substrates of an eight substrate batch, such the one shown in FIG. 2A. The eight substrate of the same batch was used for the current leakage quality control test was used. Each of the eight substrates of the batch had GaN epitaxial layer 204 formed on silicon substrate material 202. The device of FIGS. 4A and 5A has source 216, drain 218 and gate 217 formed on epitaxial layer 204 grown on original substrate material 202. The device of FIGS. 4A and 5A also has metallization contacts 219 formed on source 216 and drain 218. FIGS. 4B and 5B provide comparison between a quality control test performed to the seven substrates with the fully fabricated device shown in FIGS. 4A and 5A and the current leakage quality control test according to the present methodology, which uses only a single substrate of the batch with the ohmic electrical contact 206 as shown in FIGS. 4C and 5C (essentially identical to FIG. 2B). FIG. 4B is a plot of a critical parameter (CP) for quality control measured on the fully fabricated device (FIG. 4A) though metallization contacts 219 on drain 218 for the seven substrates of the batch versus a yield determined using the current leakage quality control test according to the present methodology performed on the single substrate of the batch before fabricating a full device as shown in FIG. 4C. FIG. 4B shows a correlation between the critical parameter (CP) for quality control measured on the fully fabricated device (FIG. 4A) though metallization contacts 219 on drain 218 for the seven substrates of the batch versus the yield determined using the current leakage quality control test according to the present methodology performed on the single substrate of the batch before fabricating a full device as shown in FIG. 4C.

FIG. 5B reports yields for multiple (eight) substrate batches determined (a) by testing each of fully fabricated devices (FIG. 5A) though metallization contacts 219 on drain 218 on each of the seven substrates of the batch (the curve with crosses) and (b) determined using the current leakage quality control test according to the present methodology performed on the single substrate of the batch before fabricating a full device as shown in FIG. 5C (the curve with rhomb s).

The data in FIGS. 4B and 5B indicate that the present methodology can predict a yield and a quality of a multi-substrate batch without performing a time consuming process, which may take several weeks, such as e.g. eight weeks, for fabrication a full device, while performing the current leakage quality control test only on one substrate of the test. The present methodology may improve yield for batches of substrates, which have epitaxial layer(s) having a lattice mismatch with a material of the substrate and/or reduce testing time and/or process cycle time for semiconductor devices formed on substrates of such batches. The present methodology may provide one or more of the following advantages: (a) it may provide a guarantee for quality of substrates of a batch with epitaxial layer(s) of a material of the substrate; (b) it may save process and/or testing costs because for batches, in which a selected substrate fails the current leakage quality control test, a time consuming device fabrication process will not be performed; (c) it may significantly reduce a cycle time for yield improvement for devices fabricated on substrates having epitaxial layer(s) such as from several weeks, e.g. 8 weeks to 1 day; (d) the process for preparing the selected substrate to the current leakage quality control test is a low cost, one metal process, which does not use an additional mask; (e) all the substrates of the batch that passed the current leakage quality control test for the selected substrate may be trackable.

For devices with crystalline silicon as original substrate material 202 and GaN epitaxial layer 204, currently existing quality control methodology are limited to in-line optical measurements. However, the in-line optical measurements do not provide a reliable prediction for the quality of the final device after the time consuming process for fabricating a device, such as the one in FIGS. 4A and 5A.

FIGS. 6A-C schematically illustrate operations, which may be performed on each remaining substrate of the batch, such as each of substrates 200A-200G in FIG. 2A, if the selected substrate, such as substrate 200H, passes the current leakage quality control test. These operations may include forming shallow trench isolation structure 211 in epitaxial layer 204. FIG. 6A shows forming an insulating layer 212 over epitaxial layer 204 defined by shallow trench isolation structure 211. FIG. 6B shows forming metal layer 213 over epitaxial layer 204 defined by shallow trench isolation structure 211. FIG. 6C shows forming semiconductor layer 214 over epitaxial layer 204 defined by shallow trench isolation structure 211 and then forming ohmic contact layer 215 on semiconductor layer 214. Lateral dimensions of each layers 212, 213, 214 and 215 may correspond to those of lateral dimensions of ohmic electrical contact 206 of the selected substrate, such as substrate 200H, which was selected for the current leakage quality control test.

Although FIGS. 4A and 5A shows only a single transistor for the sake of simplicity, in many embodiments, plural transistors may be formed on epitaxial layer 204.

Figure 7:
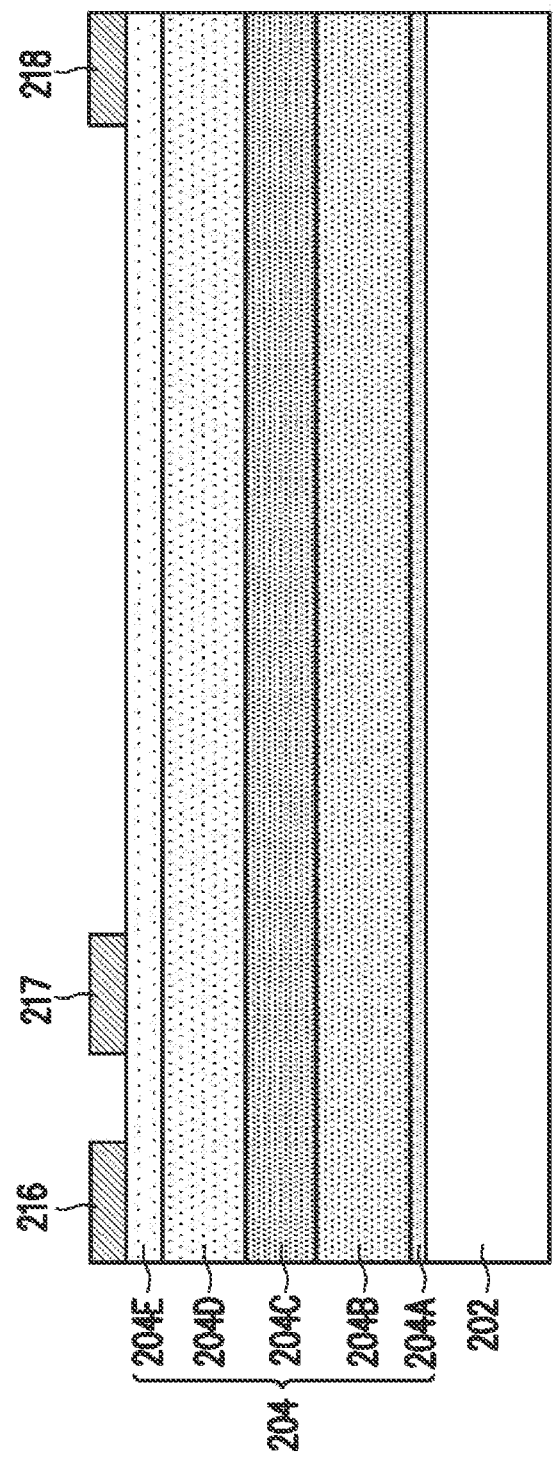
FIG. 7 illustrate an exemplary device, which can be formed on a wafer of a batch if another wafer of that batch passed the leakage test.

FIG. 7 shows a device similar to the device shown in FIGS. 4A and 5A. However, epitaxial layer 204 in FIG. 7 is a multilayer formed on multiple layers 204A, 204B, 204C, 204D and 204E. Each layer of the multilayer may differ an adjacent layer of the multilayer in at least one of a composition, doping and crystal structure. At least one layer of the multilayer is an epitaxial layer. In some embodiments, each of the layers of the multilayer may be an epitaxial layer. At least one epitaxial layer of the multilayer may have a have a lattice mismatch with a material of substrate 202.

The present disclosure also provides a semiconductor device which has a substrate and an epitaxial layer on the substrate. The epitaxial layer and the substrate have a lattice mismatch. The device includes a device region on a first part of a surface of the epitaxial layer and a seal ring region on a second part of the surface of the epitaxial layer. The device region may include a plurality of transistors; while the seal ring region may include an ohmic contact on the epitaxial layer. The ohmic contact may be used for performing a leakage current measurement on the final semiconductor device or at an intermediate stage of fabricating the device. The leakage current measurement may be used as a quality control test. The substrate with the epitaxial layer may be, for example, one of substrates 200A-200G in FIG. 2A. However, the semiconductor device does not necessarily is used together with the leakage current measurement test on selected substrate 200H as illustrated in FIG. 2B.

Figure 8:
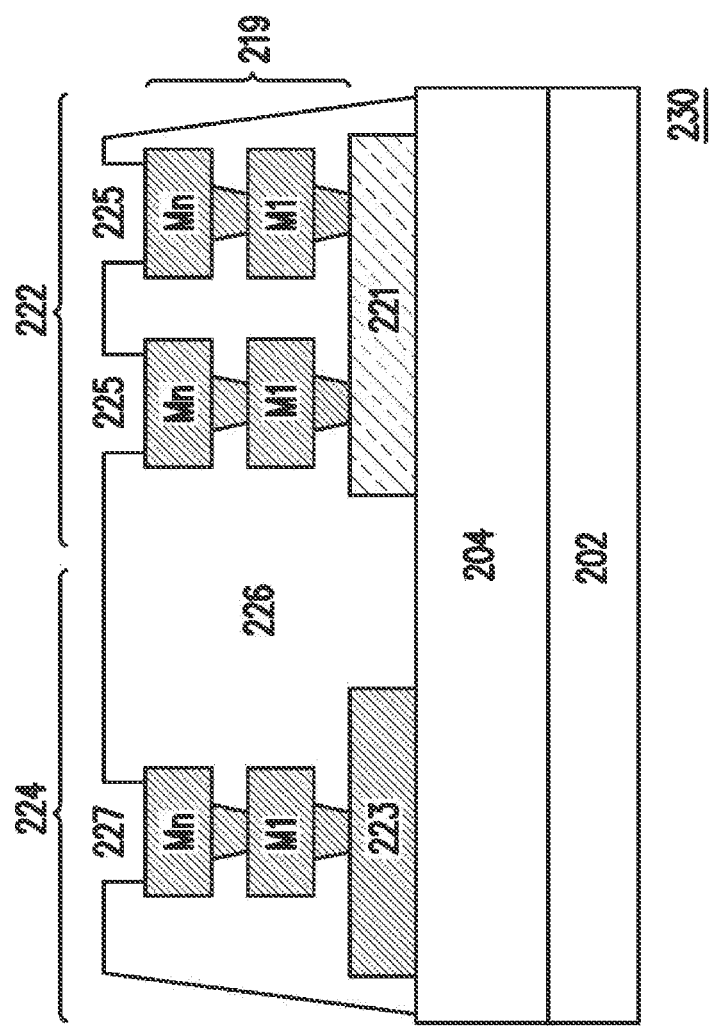
FIG. 8 shows an exemplary device with a seal ring region and a device region.

FIG. 8 shows exemplary semiconductor device 230 which has a device region and a seal ring region. Device 230 has substrate 202 and epitaxial layer 204 on substrate 202. Epitaxial layer 204 and substrate 202 have a lattice mismatch. Device 230 includes device region 222 on a first part of a surface of epitaxial layer 204 and seal ring region 224 on a second part of the surface of epitaxial layer 204. Device region 222 includes region 221 with a plurality of transistors. Each of transistors may include a source, a drain and a gate, such as elements 216, 217 and 218 in FIGS. 4A and 4B. Seal ring region 224 includes ohmic contact 223 on epitaxial layer 204. Device 230 includes one or more insulating/passivation layers shown for illustration purposes only as element 226. Such insulating/passivation layers may be formed of one or more of silicon oxide, silicon nitride or a combination thereof. Device 230 includes metallization contacts 219 (M1 closest to epitaxial layer 204 and Mn furthest from epitaxial layer 204) extending through one or more insulating/passivation layers 226. Metallization contacts 219 contact are provided for both seal ring region 224 so that M1 has electrical contact with ohmic contact 223 and for device region 222 so that M1 has electrical contact with a drain of one or more transistors in region 221. For device region 222, top contact(s) Mn are exposed/open through opening(s) 225. In some embodiments, for seal region 224, top contact(s) Mn may be exposed/open through opening(s) 227. Yet in some embodiments, top contact(s) Mn may be covered by top insulating/passivating layer 226. The top passivating/insulating layer may be formed of one or more of silicon oxide, silicon nitride or a combination thereof. Ohmic contact 223 may be similar to ohmic contact 206 in FIGS. 4C and 5C. Ohmic contact 223 may have each of its lateral dimensions, i.e. dimensions parallel to the surface of epitaxial layer 204, greater than 1 micron. Ohmic contact 223 may be formed by the process similar to the process for forming ohmic contact 206 in FIGS. 3A-D. Such process has a short process time, a good contrast and provides a good contact between metal of the ohmic contact and the epitaxial layer 204.

FIGS. 9A-B show device 230' where seal ring region 224 surrounds device region 222, see FIG. 9A which shows cross section perpendicular to the plane of FIG. 9A. In FIG. 9B, top contact(s) Mn for seal region 224 are not exposed/open. Instead, top contact(s) Mn for seal region 224 are covered by top insulating/passivating layer 226.

When top contact(s) Mn for seal region 224 are exposed/open, ohmic contact 223 may be used for current leakage measurement. For such current leakage measurement, a configuration similar to the one in FIGS. 4C and 5C may be used. For the current leakage measurement, a voltage may be applied between top contact Mn in seal ring region 224 and the bottom of substrate 202 through ohmic contact 223 on epitaxial layer 204. For applying the voltage, the bottom of substrate 202 may be grounded. The current leakage measurement performed through ohmic contact 223 on epitaxial layer 204 may serve as a quality control measurement similarly to the measurement in FIGS. 4C and 5C. The ability of performing a quality control measurement through ohmic contact 223 on epitaxial layer 204 in seal ring region 224 allows keeping device region 222, including its top contacts Mn, in an original, untouched state.

Figure 10A:
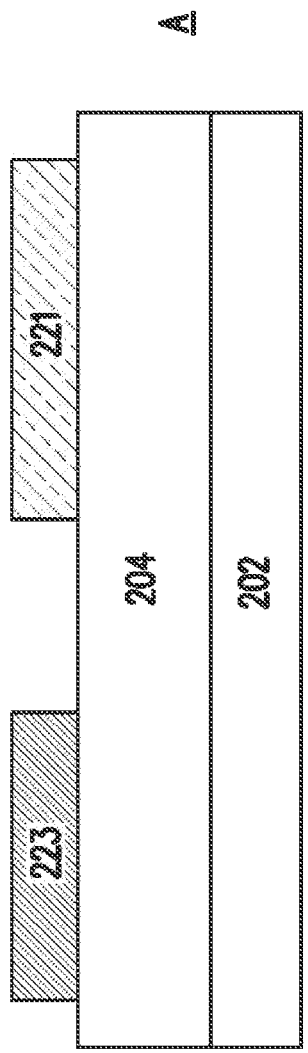
FIG. 10A-B show various stages of producing an exemplary device with a seal ring region and a device region.
Figure 10B:
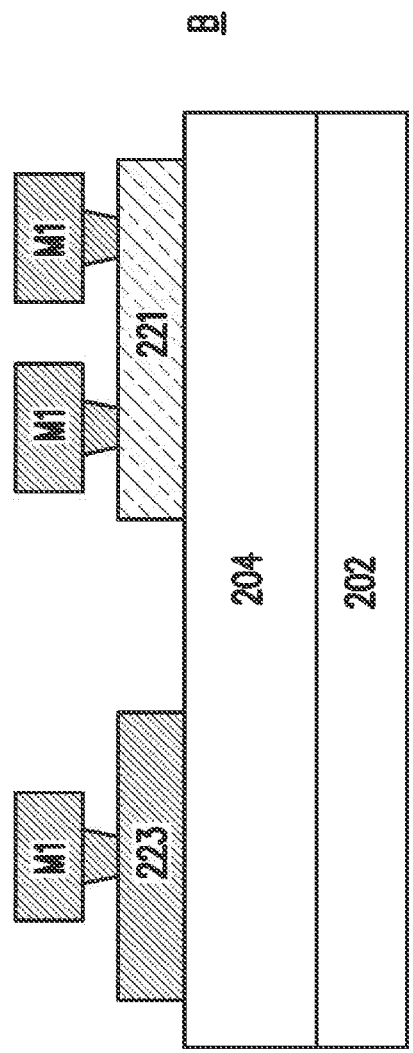

Ohmic contact 223 on epitaxial layer 204 may also be used for current leakage measurement at an intermediate stage of fabricating a semiconductor device having a seal ring region and a device region, such as devices 230 and 230' in FIGS. 8 and 9. FIG. 10A shows a device, such as device 230, at an intermediate stage after ohmic contact 223 and region 221 with a plurality of transistors, are formed on epitaxial layer 204. FIG. 10B shows a device, such as device 230, at intermediate stage after lowest metallization contacts M1 are fabricated. In seal region 224, M1 has electrical contact with ohmic contact 223. In device region 222, M1 has electrical contact with a drain of one or more transistors in region 221. For current leakage measurement at the intermediate stage illustrated in FIG. 10A, a voltage may be applied between ohmic contact 223 on epitaxial layer 204 and the bottom of substrate 202. For applying the voltage, the bottom of substrate 202 may be grounded. For current leakage measurement at the intermediate stage illustrated in FIG. 10B, a voltage may be applied between contact M1 in seal ring region 224 and the bottom of substrate 202 through ohmic contact 223 on epitaxial layer 204. For applying the voltage, the bottom of substrate 202 may be grounded. Current leakage measurement performed through ohmic contact 223 on epitaxial layer 204 at an intermediate stage, such as those illustrated in FIGS. 10A and 10B, may serve as a quality control measurement similarly to the measurement in FIGS. 4C and 5C. If the device does not pass a current leakage measurement quality control test at an intermediate stage, such as those illustrated in FIGS. 10A and 10B, it may be discarded. Also other devices fabricated on substrates of the same batch may be discarded. If the device does pass a current leakage measurement quality control test at an intermediate stage, such as those illustrated in FIGS. 10A and 10B, a next fabrication stage may be performed. For example, for the stage illustrated in FIG. 10A, such next stage may be forming metallization contacts M1.

In one aspect of the present disclosure, a method of fabricating a device includes forming a plurality of structures, such that each structure of the plurality includes a substrate and an epitaxial layer on the substrate. The epitaxial layer and the substrate have a lattice mismatch. The method further includes forming an electrical contact on the epitaxial layer of a selected structure of the plurality of structures and performing a current leakage measurement quality control test for the selected structure of the plurality of structures through the electrical contact. The method also includes forming a device on each of the remaining structures of the plurality of structures if the selected structure passed the leakage measurement quality control test or discarding each of the remaining structures of the plurality of structures if the selected structure did not pass the leakage measurement quality control test.

In another aspect of the present disclosure, a method of forming a device includes epitaxially growing an epitaxial layer on each substrate of a batch of substrates. The epitaxial layer and the substrate have a lattice mismatch. The method further involves forming an ohmic contact on the epitaxial layer of a selected substrate of the batch; applying a voltage between the ohmic contact and a surface of the selected substrate, which is opposite to the epitaxial layer, and measuring an electrical current leakage between the epitaxial layer and the substrate. The method further involves forming a device on each remaining substrate of the batch if the measured leakage for the selected substrate does not exceed a threshold current leakage value or discarding each of the remaining substrates of the batch if the measured leakage of the electrical current for the selected substrate exceeds a threshold current leakage value. The device has an active region having a surface area which corresponds to a surface area of the ohmic contact on the epitaxial layer of the selected substrate.

In yet another aspect of the present disclosure, a semiconductor device that includes a substrate and an epitaxial layer on the substrate. The epitaxial layer and the substrate have a lattice mismatch. The device includes a device region on a first part of a surface of the epitaxial layer, the device region comprising a plurality of transistors. The device also includes a seal ring region on a second part of the surface of the epitaxial layer. The seal ring region includes an ohmic contact on the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a device, comprising:
    forming a plurality of structures, each structure of said plurality consists of a substrate and an epitaxial layer on a top surface of the substrate, the epitaxial layer and the substrate have a lattice mismatch;
    forming an electrical contact on the epitaxial layer of a selected structure of said plurality to form a test structure, wherein the formed electrical contact is the only electrical contact of the formed test structure;
    performing a current leakage quality control test on the formed test structure, wherein said performing the current leakage quality control test comprises applying a voltage between the electrical contact and a bottom surface of the substrate of the test structure and measuring a current leakage between the epitaxial layer and the substrate of the test structure; and
    forming a device on each of the remaining structures of said plurality of structures if the measured leakage current for the test structure does not exceed a threshold leakage current value discarding each of the remaining structures of said plurality of structures if the measured leakage current of the test structure is greater than the threshold leakage current value test.

2. The method of claim 1, wherein the substrate comprises a Group IV semiconductor and the epitaxial layer comprises a Group III-V semiconductor.

3. The method of claim 1, wherein the substrate comprises silicon and the epitaxial layer is an epitaxial gallium nitride layer.

4. The method of claim 1, wherein the forming the electrical contact comprises forming a patterned metal layer on the epitaxial layer.

5. The method of claim 4, wherein the forming the electrical contact further comprises depositing an insulating layer over the patterned metal and etching the insulating layer to expose a surface of the patterned metal layer.

6. The method of claim 1, wherein said forming the device comprises forming a device region comprising a plurality of transistors.

7. The method of claim 6, wherein said forming the device further comprises forming a seal ring region surrounding the device region, wherein forming the seal ring region comprises forming an ohmic contact on the epitaxial layer of the structure.

8. The method of claim 7, further comprising performing a leakage current measurement through the ohmic contact of the seal ring region.

9. The method of claim 1, wherein the plurality of structures includes at least 8 structures.

10. The method of claim 1, wherein the epitaxial layer comprises a plurality of epitaxial sublayers.

11. The method of claim 5, wherein the test structure consists of the patterned metal layer, the epitaxial layer, the substrate and an unetched portion of the insulating layer around an edge of the patterned metal layer.

12. The method of claim 5, wherein the test structure consists of the patterned metal layer, the epitaxial layer, the substrate and an unetched portion of the oxide layer around an edge of the patterned metal layer.

13. A method of forming a device comprising:
    epitaxially growing an epitaxial layer on each substrate of a batch of substrates, wherein the epitaxial layer and the substrate have a lattice mismatch;
    forming an ohmic contact on the epitaxial layer of a selected substrate of the batch to form a test structure, wherein the formed ohmic contact is the only electrical contact of the test structure;
    applying a voltage between the ohmic contact and a surface of the substrate of the test structure, which surface is opposite to the epitaxial layer of the test structure, and measuring an electrical current leakage between the epitaxial layer and the substrate of the test structure; and
    forming a device on each remaining substrate of the batch if the measured leakage for the test structure does not exceed a threshold current leakage value or discarding each of the remaining substrates of the batch if the measured leakage of the electrical current for the test structure exceeds a threshold current leakage value, wherein the device has an active region having a surface area which corresponds to a surface area of the ohmic contact on the epitaxial layer of the test structure.

14. The method of claim 13, wherein the substrate is a Group IV semiconductor substrate and the epitaxial layer comprises a Group III-V semiconductor.

15. The method of claim 13, wherein the substrate is a silicon substrate and the epitaxial layer comprises GaN.

16. The method of claim 13, wherein said forming the device comprises forming a device region comprising a plurality of transistors.

17. The method of claim 13, wherein the forming the ohmic contact comprises forming a metal layer on the epitaxial layer and patterning the metal layer.

18. The method of claim 17, wherein the forming the ohmic contact further comprises depositing an oxide layer over the patterned metal layer and etching the oxide layer to expose a surface of the patterned metal layer.

19. A method of fabricating a device, comprising:
forming a plurality of structures, each structure of said plurality of structures comprising a substrate and an epitaxial layer on the substrate, the epitaxial layer and the substrate having a lattice mismatch;
forming an electrical contact on the epitaxial layer of a selected structure of said plurality of structures;
performing a current leakage quality control test for the selected structure of said plurality of structures through said electrical contact; and
forming a device on each of the remaining structures of said plurality of structures if the selected structure passed the current leakage quality control test or discarding each of the remaining structures of said plurality of structures if the selected structure did not pass the leakage measurement quality control test,
wherein said forming the device comprises forming a device region comprising a plurality of transistors and forming a seal ring region surrounding the device region, wherein forming the seal ring region comprises forming an electrical contact on the epitaxial layer of the structure.

20. The method of claim 19, further comprising performing a leakage current measurement through the electrical contact of the seal ring region.

* * * * *